(12) United States Patent
Abe et al.

(10) Patent No.: US 9,225,229 B2
(45) Date of Patent: Dec. 29, 2015

(54) SEMICONDUCTOR SWITCH CIRCUIT

(71) Applicant: KABUSHIKI KAISHA TOSHIBA, Tokyo (JP)

(72) Inventors: Hiroyuki Abe, Kanagawa (JP); Hironori Nagasawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 102 days.

(21) Appl. No.: 14/194,627

(22) Filed: Feb. 28, 2014

(65) Prior Publication Data
US 2014/0292302 A1 Oct. 2, 2014

(30) Foreign Application Priority Data

Mar. 29, 2013 (JP) .................................. 2013-074969

(51) Int. Cl.
*G05F 1/00* (2006.01)
*H02M 1/08* (2006.01)
*H03K 17/06* (2006.01)

(52) U.S. Cl.
CPC ............... *H02M 1/08* (2013.01); *H03K 17/063* (2013.01); *H03K 2217/0054* (2013.01); *H03K 2217/0081* (2013.01)

(58) Field of Classification Search
CPC ..... H02M 3/156; H02M 3/1588; H02M 3/07; Y02B 70/1466
USPC ............ 363/16, 17, 21.18, 39, 40, 49, 60, 65, 363/89, 98, 132; 323/222, 224, 266, 267, 323/271, 272, 282–288
See application file for complete search history.

(56) References Cited

U.S. PATENT DOCUMENTS

| | | | | |
|---|---|---|---|---|
| 5,754,419 | A * | 5/1998 | Ho | 363/89 |
| 6,912,139 | B2 * | 6/2005 | Kernahan et al. | 363/41 |
| 7,317,302 | B1 * | 1/2008 | Collins | 323/222 |
| 7,355,468 | B2 * | 4/2008 | de Ambroggi et al. | 327/536 |
| 7,782,027 | B2 * | 8/2010 | Williams | 323/266 |
| 2011/0050323 | A1 | 3/2011 | Seshita | |

(Continued)

FOREIGN PATENT DOCUMENTS

| | | |
|---|---|---|
| JP | 2011055099 A | 3/2011 |
| JP | 2011-071802 A | 4/2011 |

(Continued)

OTHER PUBLICATIONS

Japanese Office Action dated Apr. 17, 2015, filed in Japanese counterpart Application No. 2013-074969, 5 pages (with translation).

*Primary Examiner* — Rajnikant Patel
(74) *Attorney, Agent, or Firm* — Patterson & Sheridan, LLP

(57) ABSTRACT

A semiconductor switch circuit includes a switch between an input node and an output node that connects nodes to each other according to a control signal and a level shifter outputting the control signal at a boosted level that is greater than a power supply voltage level. The semiconductor switch circuit also includes a booster circuit to output a boosted voltage at the boosted level higher than a power supply voltage level. A control circuit is configured to control the level shifter output of the control signal to the switch. A capacitance switching circuit is included to change the capacitance of a connection between the booster circuit and the level shifter. The capacitance switching circuit can vary capacitance according to the voltage level of the booster circuit output.

20 Claims, 5 Drawing Sheets

(56) References Cited

U.S. PATENT DOCUMENTS

2011/0304310 A1   12/2011   Sotono
2012/0049938 A1   3/2012    Ishimori et al.
2012/0068757 A1   3/2012    Seshita et al.

FOREIGN PATENT DOCUMENTS

| JP | 2011259192 A | 12/2011 |
| JP | 2012049962 A | 3/2012 |
| JP | 2012-070181 A | 4/2012 |

* cited by examiner

SEMICONDUCTOR SWITCH CIRCUIT

CROSS-REFERENCE TO RELATED APPLICATION

This application is based upon and claims the benefit of priority from Japanese Patent Application No. 2013-074969, filed Mar. 29, 2013, the entire contents of which are incorporated herein by reference.

FIELD

Embodiments described herein relate generally to a semiconductor switch circuit.

BACKGROUND

In a wireless device such as a mobile phone, a semiconductor switch is used for transmission/reception switching, frequency band switching, and also antenna switching.

Such a semiconductor switch includes a booster circuit, a level shifter, and a signal transmission switch. It is required that high frequency noise is low during the switching operations and that start-up time is short.

DETAILED DESCRIPTION

Figure 1:
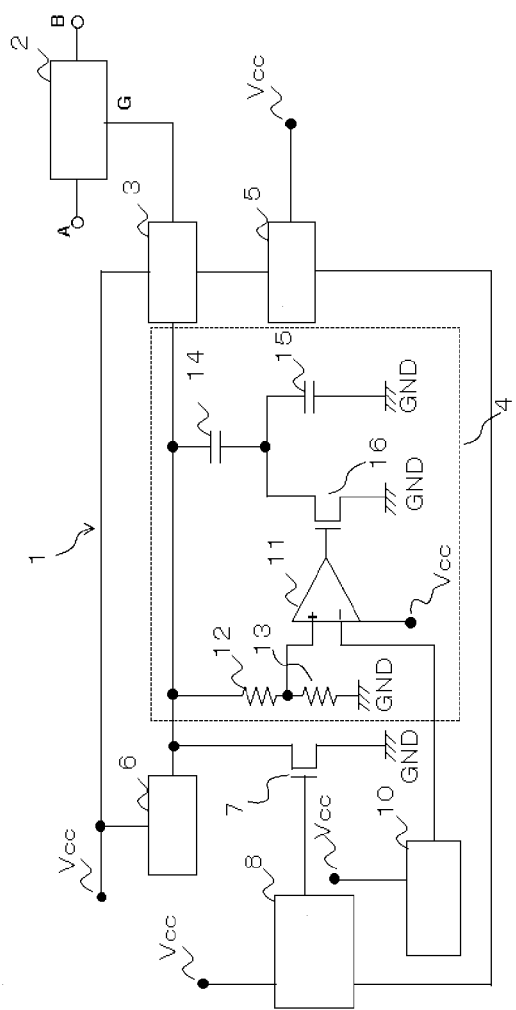
FIG. 1 is a circuit diagram illustrating an example of a configuration of a semiconductor switch circuit according to a first embodiment.

Embodiments provide a semiconductor switch circuit capable of suppressing an increase in noise and shortening start-up time.

In an embodiment, a semiconductor switch circuit includes a signal transmission switch between an input signal node and an output signal node. The signal transmission switch is configured to connect the input and output signal nodes to each other according to a first control signal. For example, when the first control signal is at a high signal level the signal transmission switch may electrically connect the input signal node to the output signal node. A level shifter in the semiconductor switch circuit is configured to output the first control signal at a boosted voltage level that is greater than a first power supply voltage level when a second control signal of a first level and not a second level is supplied to the level shifter. A booster circuit is included in the semiconductor switch circuit to receive a power supply voltage at the first power supply voltage level and output a boosted voltage at the boosted voltage level to the level shifter. A control circuit in the semiconductor switch circuit is configured to supply the second control signal to the level shifter. The second control signal may, for example, correspond to an externally supplied control signal corresponding to a wireless device application requirement. A capacitance switching circuit in the semiconductor switch circuit is configured to change a capacitance level of a connection between an output node of the booster circuit and a ground node according to a level of the boosted voltage.

In general, according to another embodiment, a semiconductor switch circuit includes a signal transmission switch operating (switching ON/OFF conductance states) according to a first control signal, a level shifter that outputs the first control signal when a predetermined voltage (a voltage at a boosted voltage level) is supplied, and a second control signal is input, a booster circuit that boosts a power supply voltage to output the predetermined voltage to the level shifter, a control circuit that outputs the second control signal to the level shifter, a reference voltage circuit that generates a reference voltage, a capacitance switching circuit that includes a comparator that receives and compares voltages corresponding to the predetermined voltage and the reference voltage, a first switch connected to an output node of the comparator, a first capacitive element, a second capacitive element and first and second resistance elements. The capacitance switching circuit is configured to change an equivalent capacitance of the combination of the first capacitive element and the second capacitive element in accordance with an output voltage from the booster circuit, and a second switch that switches a connection between the booster circuit and the ground.

Embodiments of the present exemplary embodiment will now be described with reference to the drawings. The drawings are schematic so as to facilitate the description, and the shape, dimension and size-relationship of each element in the drawings are not limited in the actual implementation to those indicated in the drawings and can be modified suitably within the ranges in which the effects of the present exemplary embodiment are obtained.

First Embodiment

FIG. 1 is a circuit diagram illustrating an example of a configuration of a semiconductor switch circuit 1 according to a first embodiment. The semiconductor switch circuit 1 includes a signal transmission switch 2, a level shifter 3, a capacitance switching circuit 4, a control circuit 5, a booster circuit 6, a second switch 7, a switching circuit 8, external power supply voltage Vcc and a reference voltage circuit 10.

Figure 2B:
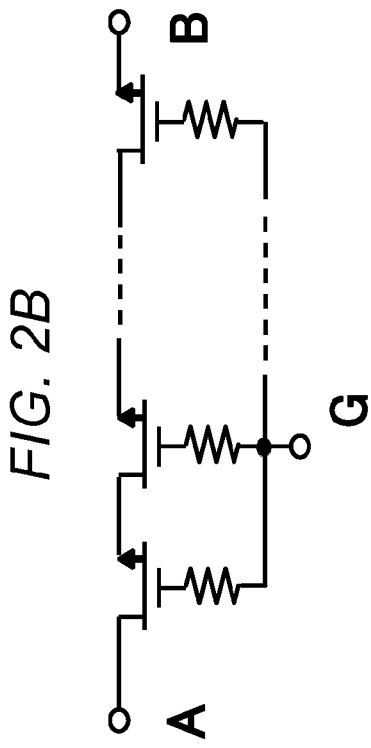
FIGS. 2A to 2C are circuit diagrams illustrating an example of a configuration of a signal transmission switch used in the semiconductor switch circuit according to the first embodiment.
Figure 2A:
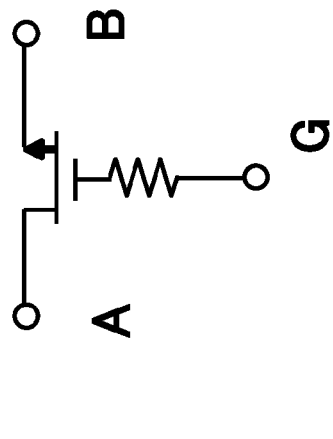
Figure 2C:
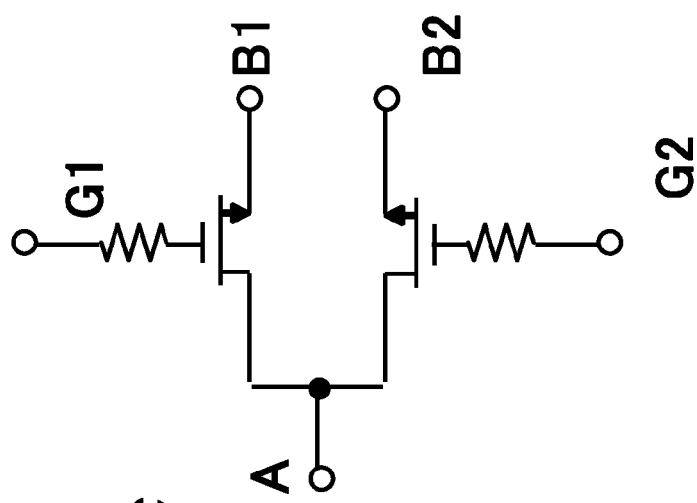

The signal transmission switch 2 is connected to a terminal A and a terminal B which are an input terminal or node and an output terminal or node, respectively, for a high frequency signal. FIGS. 2A to 2C are circuit diagrams illustrating an example of a configuration of the signal transmission switch 2 used in the semiconductor switch circuit 1 according to the first embodiment. A unit circuit of the signal transmission switch 2 may be as shown in FIG. 2A, in which a resistance element is connected in series to a gate of an NMOS (n-channel type Metal Oxide Semiconductor). Other possible examples include a plurality of unit circuits connected as shown in FIG. 2B and a signal path branched into two or more paths with the terminal A serving as a branch point as shown in FIG. 2C.

The level shifter 3 is connected to the signal transmission switch 2, the control circuit 5, the booster circuit 6 and the external power supply voltage Vcc. The level shifter 3 converts a HIGH output signal from the control circuit 5 into voltage Vp. Then, with voltage Vp as a HIGH level and 0V as a LOW level, the output from the level shifter 3 serves as a first control signal supplied to the signal transmission switch 2.

The level shifter 3 applies a control voltage (first control signal) to a control terminal G of the unit circuit which is a control terminal or node, and thereby controls the ON/OFF state of the signal transmission switch 2. The high frequency signal is transmitted from the terminal A to the terminal B or from the terminal B to the terminal A. Because the unit circuit in the signal transmission switch 2 is a NMOS type transistor, in order to turn the signal transmission switch 2 to the ON state, voltage above the threshold of the NMOS transistor is required to be applied between the gate and the source of the NMOS transistor. On the other hand, in order to turn the signal transmission switch 2 to the OFF state, voltage below the threshold of the NMOS transistor is required to be applied between the gate and the source of the NMOS transistor.

Here, when the signal transmission switch 2 is turned to the ON state, if the control voltage applied is greater than the threshold voltage but less than or equal to the positive gate withstand voltage (breakdown voltage) of the NMOS, then the ON-resistance of the NMOS transistor can be improved, thus improving the high frequency loss properties of the transmission switch 2. And when the signal transmission switch 2 is turned to the OFF state, and the control voltage is set to be less than or equal to the negative gate withstand voltage of the NMOS transistor the impedance of the NMOS transistor can be increased, improving the high frequency leakage properties thereof.

The control circuit 5 is connected to the level shifter 3 and the switching circuit 8 and outputs a control signal to control ON/OFF of the level shifter 3 and the switching circuit 8.

For example, the booster circuit 6 has a plurality of diodes and capacitors, and is connected to the second switch 7, the level shifter 3, and the external power supply voltage Vcc. The booster circuit 6 is supplied with power from the external power supply voltage Vcc and boosts then outputs a boosted voltage (e.g., voltage Vp). In the present embodiment, the semiconductor switch circuit 1 includes the booster circuit 6, thus voltage Vp higher than the voltage Vcc of the external power supply voltage Vcc can be applied to the signal transmission switch 2.

The capacitance switching circuit 4 includes a comparator 11, a first resistance element 12, a second resistance element 13, a first capacitive element 14, a second capacitive element 15 and a first switch 16.

A common connection node between the first resistance element 12 and the second resistance element 13 is connected to the "+" (plus sign) input terminal of the comparator 11, and the reference voltage circuit 10 is connected to the "−" (minus sign) input terminal of the comparator 11. The first switch 16 is connected to the output terminal of the comparator 11.

When reference voltage Vref is output from the reference voltage circuit 10 and the voltage Vp is output from the booster circuit 6, respectively, the comparator 11 compares divided voltage Vpr (obtained from dividing the voltage Vp according to the resistance ratio) and the reference voltage Vref. An output signal is output to the first switch 16 based on the comparison of these voltage values.

Figure 3:
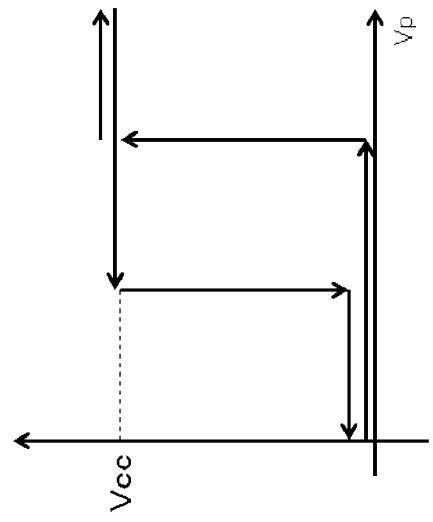
FIG. 3 is a hysteresis characteristic diagram of a comparator in the semiconductor switch circuit according to the first embodiment.

Note that, in the present embodiment, the comparator 11 has a hysteresis characteristic. FIG. 3 is a hysteresis characteristic diagram of the comparator in the semiconductor switch circuit 1 according to the first embodiment. Thus, the first switch 16 is prevented from turning on/off based on the amplitude of the alternating voltage of the divided voltage Vpr.

The resistance values of the first resistance element 12 and the second resistance element 13 are defined as R1 and R2, respectively. The resistance ratio of the first and second resistance elements 12, 13 is set in such a manner that the divided voltage Vpr obtained from dividing the voltage Vp by way of the first resistance element 12 and the second resistance element 13 is equal to the reference voltage Vref. For example, in the case of the first embodiment, the resistance ratio is set in such a manner that the relation of divided voltage Vpr=reference voltage Vref×R2/(R1+R2) is obtained.

The first switch 16 connects a ground GND terminal, which is a ground terminal or node, and the first and second capacitive elements 14 and 15 based on the output signal from the comparator 11. The first switch 16 is turned to the ON state when voltage Vpr from the booster circuit 6 is greater than the reference voltage Vref, and the first switch 16 is turned to the OFF state when divided voltage Vpr from the booster circuit 6 is less than the reference voltage Vref.

The action of the first switch 16 allows the first and second capacitive elements 14 and 15 to change the equivalent capacitance Ceq. Here, the capacitance magnitudes of the first and second capacitive elements 14 and 15 are set to C1 and C2, respectively.

When the voltage of the external power supply voltage Vcc is supplied, the reference voltage circuit 10 applies the reference voltage Vref to the comparator 11. The reference voltage Vref is a voltage less than or equal to the external power supply voltage Vcc.

The switching circuit 8 is connected to the external power supply voltage Vcc, the control circuit 5, and the second switch 7, and operates based on the third control signal from the control circuit 5.

The switching circuit 8 is connected to the control circuit 5 and the second switch 7. The switching circuit 8 supplies a signal to the second switch 7 according to the second control signal from the control circuit 5.

The second switch 7 is connected to the switching circuit 8, and switches the connection of the ground GND terminal and the booster circuit 6 based on the output signal from the switching circuit 8.

Figure 4:
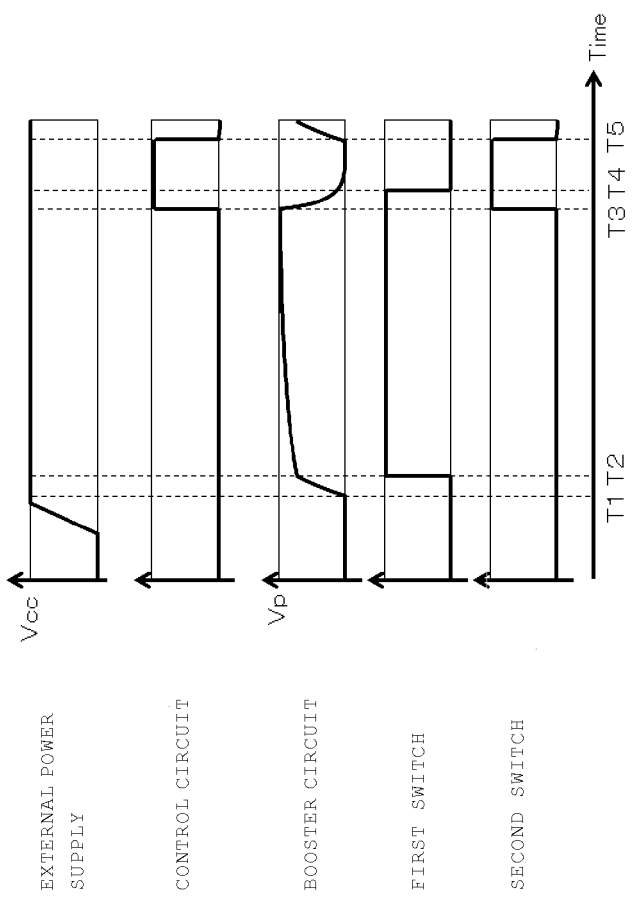
FIG. 4 is a timing chart illustrating the action of the semiconductor switch circuit according to the first embodiment.

FIG. 4 is a timing chart illustrating the action of the semiconductor switch circuit 1 according to the first embodiment. FIG. 4 shows the variation per time of signal output from the first and second switches 16 and 7 and the power supply voltage.

First, external power supply voltage Vcc is applied to the booster circuit 6 between the time T1 and the time T2. In response, the booster circuit 6 supplies voltage to the level shifter 3. At this time, as long as withstand voltage allows, the gate of the signal transmission switch 2 is provided a high voltage and the ON resistance is reduced. For this purpose, the booster circuit 6 increases the gate voltage. Note that, at this time, the equivalent capacitance Ceq of the first and second capacitive elements 14 and 15 is $[C1 \times C2/(C1+C2)]$.

At the time T1, the divided voltage Vpr and the reference voltage Vref are input into the comparator 11. The comparator 11 compares these voltages and outputs a signal to the first switch 16 based on the size-relationship of the divided voltage Vpr and the reference voltage Vref. At this time, since the divided voltage Vpr is smaller than the reference voltage Vref, a LOW signal is output.

When divided voltage Vpr is greater than reference voltage Vref between the time T2 and the time T3, the comparator 11 outputs a HIGH signal to the first switch 16. The first switch 16 is turned to the ON state, and connects the common connection portion of the first and second capacitive elements 14 and 15 with the ground GND terminal. At this time, the equivalent capacitance Ceq of the first and second capacitive elements 14 and 15 is C1.

Thus, the equivalent capacitance Ceq in the ON state (Ceq (on)) is greater than the equivalent capacitance Ceq in the OFF state (Ceq (off)).

Then, when a predetermined voltage is supplied from the booster circuit 6, and the second control signal is input from the control circuit 5, the level shifter 3 outputs the first control signal to the signal transmission switch 2. The signal transmission switch 2 operates based on the first control signal.

When the booster circuit 6 stops boosting the voltage between the time T3 and the time T4, the signal transmission switch 2 stops operating. Then, the control circuit 5 outputs the third control signal to the switching circuit 8, and the switching circuit 8 outputs a HIGH signal to the second switch 7 based on the third control signal. The second switch 7 is turned to the ON state based on the HIGH signal, and connects the booster circuit 6 and the ground GND terminal. This forcibly causes the voltage of the booster circuit 6 to be set to around 0V. At this time, the charge accumulated in the first capacitive element 14 is also discharged.

When the voltage of the booster circuit 6 becomes lower than or equal to a predetermined value between the time T4 and the time T5, the comparator 11 outputs a LOW signal, and the first switch 16 is turned to the OFF state. In this manner, the equivalent capacitance Ceq by the first and second capacitive elements 14 and 15 is set to the same state as that at the starting time of voltage boost.

At the time T5 and afterward, when the control circuit 5 outputs a LOW signal to the second switch 7, the second switch 7 is turned to the OFF state, therefore, the booster circuit 6 and the ground GND terminal are disconnected. Thus, the booster circuit 6 starts to boost voltage.

The operation and effect of the present embodiment will be described in general terms. The semiconductor switch circuit 1 includes a capacitive element. The capacitive element smoothes generated voltage, and, even if an alternating voltage generated by the booster circuit 6 changes, or noise is generated due to the amplitude of alternating voltage, the capacitive element can suppress this noise. This allows the semiconductor switch circuit 1 to reduce the impact of noise on the level shifter 3 and the signal transmission switch 2.

Further, in the present embodiment, the semiconductor switch circuit 1 includes the first and second capacitive elements 14 and 15 and changes the equivalent capacitance Ceq of the first and second capacitive elements 14 and 15 depending on voltage applied from the booster circuit 6.

The semiconductor switch circuit 1 according to the present embodiment includes the first and second capacitive elements 14 and 15, and, until the external power supply voltage Vcc reaches a predetermined voltage after start-up, the equivalent capacitance Ceq is kept low: $C1 \times C2/(C1+C2)$. The equivalent capacitance Ceq is increased after the predetermined voltage is reached. That is, since voltage is subject to be boosted when capacitance is small, the equivalent capacitance Ceq is controlled depending on the voltage to be boosted, allowing the boosting time to be shortened. Consequently, the start-up time of the signal transmission switch 2 can be shortened.

Thus, the semiconductor switch circuit 1 can shorten start-up time while suppressing an increase in the noise due to the amplitude of alternating voltage.

Second Embodiment

Figure 5:
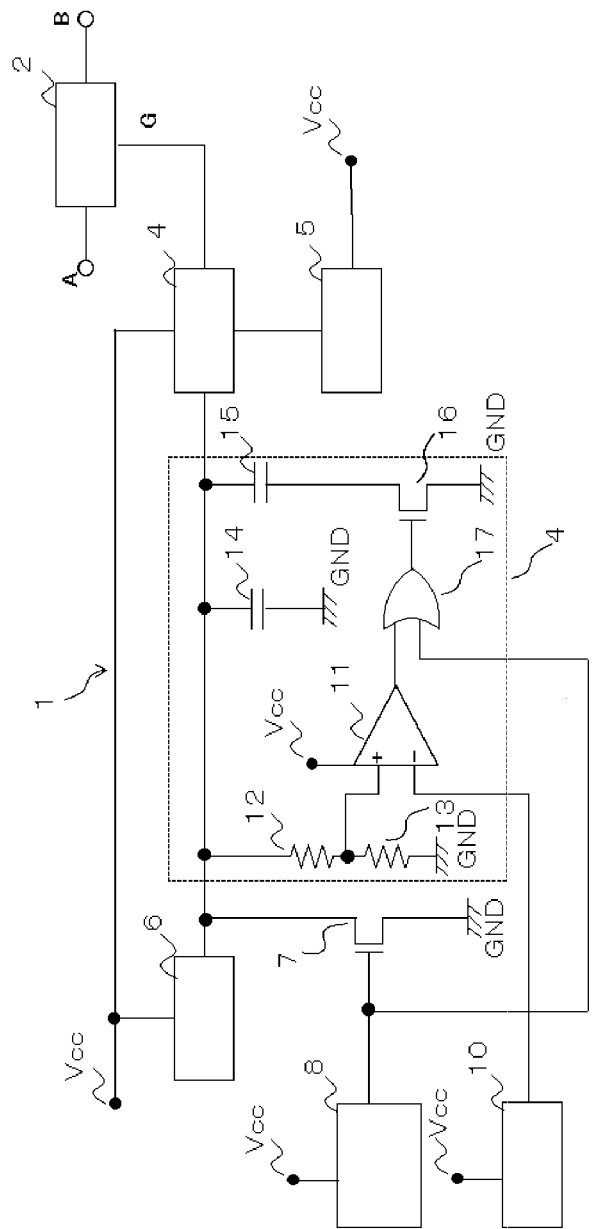
FIG. 5 is a circuit diagram illustrating an example of a configuration of a semiconductor switch circuit according to a second embodiment.

A second embodiment will be described. FIG. 5 is a circuit diagram illustrating an example of a configuration of a semiconductor switch circuit 1 according to a second embodiment.

In the semiconductor switch circuit 1 according to the second embodiment, the first and second capacitive elements 14 and 15 are connected in parallel to the common connection portion of the booster circuit 6 and the level shifter 3. In the first embodiment, only the first capacitive element 14 is connected to the common connection portion of the booster circuit 6 and the level shifter 3. The other side of the first capacitive element 14 is connected to the ground GND. Further, the other side of the second capacitive element 15 is connected to the ground GND through the change-over route by the first switch 16.

In addition, the semiconductor switch circuit 1 of the second embodiment includes an OR circuit 17. The input terminal of the OR circuit 17 is connected to the output terminal of the comparator 11 and the switching circuit 8, and the output terminal of the OR circuit 17 is connected to the first switch 16.

The action of the semiconductor switch circuit 1 according to the second embodiment will be described in general terms. First, the booster circuit 6 starts to boost the voltage. At this time, the divided voltage Vpr is less than reference voltage Vref; in response, the comparator 11 outputs a LOW signal to the OR circuit 17. Further, the switching circuit 8 outputs a LOW signal to the OR circuit 17. The OR circuit 17 outputs a LOW signal to the first switch 16 based on these output signals. Since the first switch 16 is turned to the ON state when receiving a HIGH signal, the first switch 16 remains in the OFF state at this time. That is, in this phase, the second capacitive element 15 is not connected to the booster circuit 6. At this time, the equivalent capacitance connected to the booster circuit 6 is Ceq(off)=C1.

When divided voltage Vpr becomes greater than reference voltage Vref, the comparator 11 outputs a HIGH signal to the OR circuit 17. The OR circuit 17 outputs a HIGH signal to the first switch 16 based on the LOW signal from the switching circuit 8 and the output signal from the comparator 11. Thus, the first switch 16 is turned to the ON state, and connects the second capacitive element 15 and the ground GND. At this time, the equivalent capacitance Ceq(on) becomes C1+C2. As a result, since the equivalent capacitance Ceq becomes large, the amplitude of the alternating voltage output from the booster circuit 6 can be kept low as in the first embodiment.

The switching circuit 8 outputs a HIGH signal not only to the second switch 7 but also to the OR circuit 17. Thus, the first switch 16 is also turned to the ON state, and the charge accumulated in the second capacitive element 15 is also discharged to the ground GND terminal on the side of the first switch 16.

Note that, as in the first embodiment, the first switch 16 and the second switch 7 may be achieved using NMOS transistors.

Here, the first and second capacitive elements 14 and 15 are connected in parallel, thus the boosting time can be shortened similarly to the first embodiment by changing the equivalent capacitance Ceq provided by the first and second capacitive elements 14 and 15.

In the second embodiment, the equivalent capacitance Ceq (2) of the combination of the first and second capacitive elements 14 and 15 ranges from C1 at the minimum to C1+C2 at the maximum. When C1=10 pF and C2=5 pF, respective equivalent capacitances are 10 pF and 15 pF. On the other hand, the equivalent capacitance Ceq (1) in the first embodiment ranges from $C1 \times C2/(C1+C2)=3$ pF at the minimum to C1=10 pF at the maximum. That is, the equivalent capacitance Ceq (2) in the second embodiment can obtain a larger equivalent capacitance even if the capacitive elements 14 and 15 are sized the same as those of the first embodiment. Larger equivalent capacitance Ceq can further suppress noise of the voltage Vp due to the amplitude of the alternating voltage of the booster circuit 6.

Third Embodiment

Figure 6:
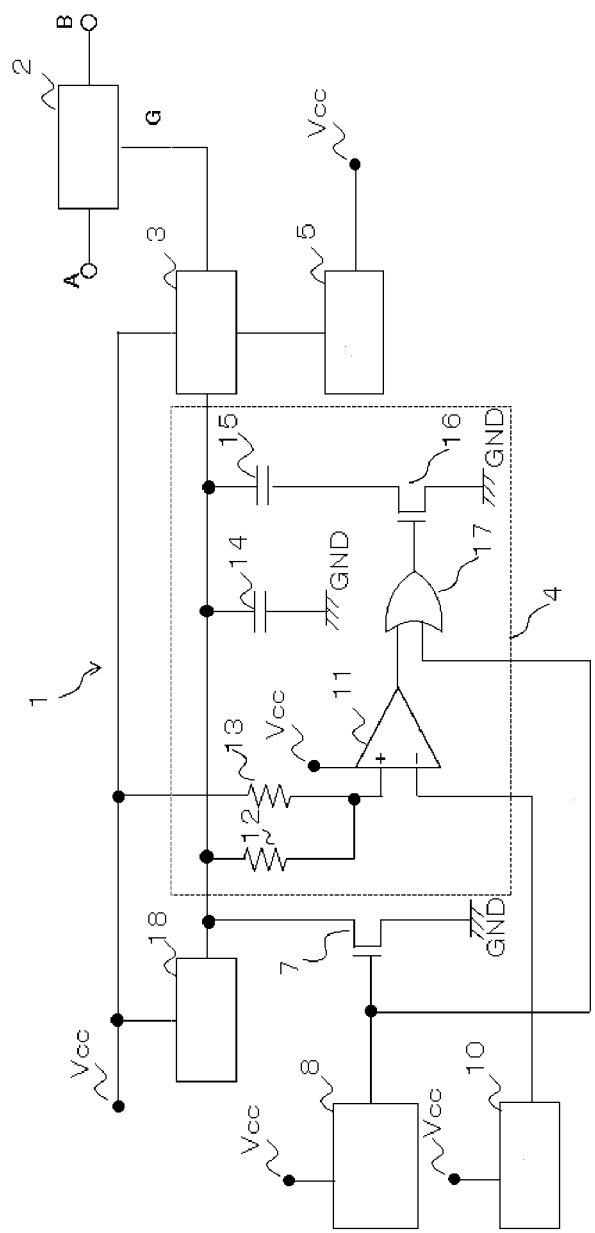
FIG. 6 is a circuit diagram illustrating an example of a configuration of a semiconductor switch circuit according to a third embodiment.

FIG. 6 is a circuit diagram illustrating an example of a configuration of the semiconductor switch circuit 1 according to a third embodiment. The third embodiment is implemented to negatively bias the voltage between the gate and the source of the NMOS transistor of signal transmission switch 2. The third embodiment is different from the second embodiment in that Vnr is a voltage divided from the voltage Vn (<0) generated by a negative voltage generation circuit 18 and the external power supply voltage Vcc by way of resistance elements, and this Vnr is compared to the reference voltage Vref. Note that since Vcc>0 and Vn<0, the reference voltage Vref can be selected as ground GND potential or 0V.

The description of the action of the third embodiment is omitted because the action is similar to that of the second embodiment. In this third embodiment, the external power supply voltage Vcc can be applied to the level shifter 3 as a HIGH level, and the voltage Vn of the negative voltage generation circuit 18 can be applied to the signal transmission switch 2 as a LOW level. Thus, ON/OFF switching is possible between positive and negative voltages.

In this third embodiment, when the signal transmission switch 2 is turned to the OFF state, the lower control voltage that is less than or equal to the negative gate breakdown voltage of the NMOS transistor can increase the impedance between the terminal A and the terminal B of the NMOS transistor, improving the high frequency loss properties thereof.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor switch circuit, comprising:
   a signal transmission switch between an input signal node and an output signal node and configured to connect the input and output signal nodes to each other according to a first control signal;
   a level shifter configured to output the first control signal at a boosted voltage level that is greater than a first power supply voltage level when a second control signal of a first level and not a second level is supplied to the level shifter;
   a booster circuit configured to receive a power supply voltage at the first power supply voltage level and output a boosted voltage at the boosted voltage level to the level shifter;
   a control circuit configured to supply the second control signal to the level shifter; and
   a capacitance switching circuit configured to change a capacitance level of a connection between an output node of the booster circuit and a ground node according to a level of the boosted voltage.

2. The semiconductor switch circuit of claim 1, wherein the capacitance switching circuit includes:
   a comparator configured to receive a first voltage corresponding to the boosted voltage at a first input node and a reference voltage at a second input node and to output a comparison result corresponding to a comparison between the first voltage and the reference voltage;
   a first capacitive element having a first end connected to the output node of the booster circuit;
   a second capacitive element connected between a second end of the first capacitive element and the ground node; and
   a first switch having a conductance pathway with a first end connected to a node between the second end of the first capacitive element and a second end connected to the ground node, the first switch configured to switch a conductance state of the conductance pathway according to the comparison result.

3. The semiconductor switch circuit of claim 2, further comprising:
   a second switch that connects the output node of the booster circuit to the ground node according to a third control signal output from the control circuit.

4. The semiconductor switch circuit of claim 3, further comprising:
   a switching circuit connected between the control circuit and the second switch, wherein the third control signal is supplied to the switching circuit and an output from the switching circuit is supplied to a control node of the second switch.

5. The semiconductor switch circuit of claim 2, further comprising:
   a reference voltage generation circuit configured to output the reference voltage to the capacitance switching circuit.

6. The semiconductor switch circuit of claim 2, further comprising:
   a first resistive element with a first end connected to the output node of the booster circuit and a second end connected to the first input node of the comparator; and
   a second resistive element with a first end connected to a node that is between the first resistive element and the first input node and a second end that is connected to the ground node.

7. The semiconductor switch circuit of claim 1, wherein the signal transmission switch comprises a plurality of transistors.

8. The semiconductor switch circuit of claim 1, wherein the signal transmission switch comprises an n-channel type metal oxide semiconductor transistor.

9. The semiconductor switch circuit of claim 1, wherein the capacitance switching circuit includes:
   a comparator configured to receive a first voltage corresponding to the boosted voltage at a first input node and a reference voltage at a second input node and to output a comparison result corresponding to a comparison between the first voltage and the reference voltage;
   a first capacitive element having a first end connected to the output node of the booster circuit and a second end connected to the ground node;
   a second capacitive element with a first end connected to the output node of the booster circuit;
   a second switch that connects the output node of the booster circuit to the ground node according to a third control signal output from the control circuit; and
   an OR circuit having a first OR circuit input node connected to an output node of the comparator at which the comparison result is output and a second OR circuit input node connected to a control electrode of the second switch, an output node of the OR circuit connected a control electrode of the first switch.

10. The semiconductor switch circuit of claim 9, the capacitance switching circuit further including:
a first resistance element with a first end connected the output node of the booster circuit and a second end connected to the first input node of the comparator; and
a second resistance element with a first end connected to the second end of the first resistance element and a second end connected to the ground node.

11. The semiconductor switch circuit of claim 9, the capacitance switching circuit further including:
a first resistance element with a first end connected the output node of the booster circuit and a second end connected to the first input node of the comparator; and
a second resistance element with a first end connected to the second end of the first resistance element and a second end connected to a power supply voltage input node at which the power supply voltage of the first power supply voltage level is received, wherein
the boosted voltage level is a negative voltage relative to a ground potential.

12. A semiconductor switch circuit, comprising:
a signal transmission switch between an input signal node and an output signal node and configured to connect the input and output signal nodes to each other according to a first control signal;
a level shifter configured to output the first control signal at a boosted voltage level that is greater than a first power supply voltage level when a second control signal of a first level and not a second level is supplied to the level shifter;
a booster circuit configured to receive a power supply voltage at the first power supply voltage level and output a boosted voltage at the boosted voltage level to the level shifter;
a control circuit configured to supply the second control signal to the level shifter; and
a capacitance switching circuit including:
a comparator configured to receive a first voltage corresponding to the boosted voltage at a first input node and a reference voltage at a second input node and to output a comparison result corresponding to a comparison between the first voltage and the reference voltage;
a first capacitive element having a first end connected to the output node of the booster circuit;
a second capacitive element connected between a second end of the first capacitive element and a ground node; and
a first switch having a conductance pathway with a first end connected to a node between the second end of the first capacitive element and a second end connected to the ground node, the first switch configured to switch a conductance state of the conductance pathway according to the comparison result.

13. The semiconductor switch circuit of claim 12, further comprising:
a second switch that connects the output node of the booster circuit to the ground node according to a third control signal output from the control circuit.

14. The semiconductor switch circuit of claim 13, further comprising:
a switching circuit connected between the control circuit and the second switch, wherein the third control signal is supplied to the switching circuit and an output from the switching circuit is supplied to a control node of the second switch.

15. The semiconductor switch circuit of claim 12, further comprising:
a reference voltage generation circuit configured to output the reference voltage to the capacitance switching circuit.

16. A semiconductor switch circuit, comprising:
a signal transmission switch between an input signal node and an output signal node and configured to connect the input and output signal nodes to each other according to a first control signal;
a level shifter configured to output the first control signal at a boosted voltage level that is greater than a first power supply voltage level when a second control signal of a first level and not a second level is supplied to the level shifter;
a booster circuit configured to receive a power supply voltage at the first power supply voltage level and output a boosted voltage at the boosted voltage level to the level shifter;
a control circuit configured to supply the second control signal to the level shifter; and
a capacitance switching circuit including:
a comparator configured to receive a first voltage corresponding to the boosted voltage at a first input node and a reference voltage at a second input node and to output a comparison result corresponding to a comparison between the first voltage and the reference voltage;
a first capacitive element having a first end connected to the output node of the booster circuit and a second end connected to a ground node;
a second capacitive element with a first end connected to the output node of the booster circuit;
a second switch that connects the output node of the booster circuit to the ground node according to a third control signal output from the control circuit; and
an OR circuit having a first OR circuit input node connected to an output node of the comparator at which the comparison result is output and a second OR circuit input node connected to a control electrode of the second switch, an output node of the OR circuit connected a control electrode of the first switch.

17. The semiconductor switch circuit of claim 16, further comprising:
a second switch that connects the output node of the booster circuit to the ground node according to a third control signal output from the control circuit.

18. The semiconductor switch circuit of claim 16, the capacitance switching circuit further including:
a first resistance element with a first end connected the output node of the booster circuit and a second end connected to the first input node of the comparator; and
a second resistance element with a first end connected to the second end of the first resistance element and a second end connected to the ground node.

19. The semiconductor switch circuit of claim 16, the capacitance switching circuit further including:
a first resistance element with a first end connected the output node of the booster circuit and a second end connected to the first input node of the comparator; and
a second resistance element with a first end connected to the second end of the first resistance element and a second end connected to a power supply voltage input node at which the power supply voltage of the first power supply voltage level is received.

20. The semiconductor switch circuit of claim 19, wherein the boosted voltage level is a negative voltage relative to a ground potential.

\* \* \* \* \*